(12) United States Patent
Gossmann

(10) Patent No.: US 7,187,218 B2
(45) Date of Patent: Mar. 6, 2007

(54) RESET GENERATOR CIRCUIT FOR GENERATING A RESET SIGNAL

(75) Inventor: Timo Gossmann, Neubiberg (DE)

(73) Assignee: Infineon Technologies AG, Munich (DE)

( * ) Notice: Subject to any disclaimer, the term of this patent is extended or adjusted under 35 U.S.C. 154(b) by 144 days.

(21) Appl. No.: 10/912,986

(22) Filed: Aug. 6, 2004

(65) Prior Publication Data
US 2005/0057287 A1    Mar. 17, 2005

(51) Int. Cl.
H03L 7/00 (2006.01)
(52) U.S. Cl. .................. 327/142; 327/143; 327/198
(58) Field of Classification Search ............... None
See application file for complete search history.

(56) References Cited

U.S. PATENT DOCUMENTS

| | | | | |
|---|---|---|---|---|
| 4,300,065 | A | 11/1981 | Remedi et al. | 327/426 |
| 4,591,745 | A | 5/1986 | Shen | 327/143 |
| 4,902,910 | A | 2/1990 | Hsieh | 327/143 |
| 5,485,111 | A * | 1/1996 | Tanimoto | 327/143 |
| 5,489,863 | A * | 2/1996 | Saijo | 327/142 |
| 6,973,155 | B2 * | 12/2005 | Boerstler et al. | 377/47 |
| 2005/0189970 | A1 * | 9/2005 | Nakatake et al. | 327/143 |

FOREIGN PATENT DOCUMENTS

| | | |
|---|---|---|
| DE | 195 34 785 C1 | 1/1998 |
| EP | 0 298 215 B1 | 1/1989 |

* cited by examiner

Primary Examiner—Tuan T. Lam
Assistant Examiner—Hiep Nguyen
(74) Attorney, Agent, or Firm—Eschweiler & Associates, LLC (57) ABSTRACT

A reset generator circuit has an oscillator circuit and a delay circuit having a clock signal input, which is connected to an output of the oscillator circuit. The delay circuit can be activated by a control signal at a control input and is designed for outputting a first signal after a first time period and for outputting a second signal after a time period after the outputting of the first signal. The reset generator circuit comprises a generator circuit designed for outputting a reset signal in the event of detection of the first signal up to the detection of the second signal. Furthermore, the reset generator circuit contains a comparison device designed for a comparison of a supply potential with a potential threshold value and for outputting the control signal in the event of the potential threshold value being exceeded. The delay circuit and the generator circuit can be controlled by the comparison device.

13 Claims, 5 Drawing Sheets

RESET GENERATOR CIRCUIT FOR GENERATING A RESET SIGNAL

REFERENCE TO RELATED APPLICATIONS

This application claims the benefit of the priority date of German application DE 103 36 480.3, filed on Aug. 8, 2003, the contents of which are herein incorporated by reference in their entirety.

FIELD OF THE INVENTION

The invention relates to a reset generator circuit for generating a reset signal.

BACKGROUND OF THE INVENTION

Turned-off digital subcircuits that are started after the application of a supply voltage are usually in an undefined or unknown operating state after said application. An error-free function is accordingly not ensured. For this reason, sequential digital circuits are usually formed together with reset circuits or reset generators that put the circuit into a defined start state when the supply voltage is applied to said circuit.

In this case, it must be taken into account that generally external parameters, for example temperature ranges or process fluctuations, and also a rise in the supply voltage up to the required value, are not known beforehand, so that the function of the reset generator or reset circuit has to be ensured over a wide parameter range. In addition, the reset generator should generate the reset signal as far as possible for as long as needed compensate for an impairment of the reset signal on the path to the individual circuit parts. Such an impairment or degradation may occur due to the fact that the supply voltage is not yet present at a sufficiently high level for all of the circuit parts. After the resetting of the digital circuit parts, the reset generator should consume as little current as possible, if any at all. Moreover, it is desirable for the reset generator to become active again immediately after a dip in the supply voltage and to generate a new reset pulse.

Reset circuits usually operate with low-pass filtering to generate an auxiliary signal from a rising supply voltage. In this case, the rise of the auxiliary signal is lower than that of the supply voltage itself. After some time, the supply voltage reaches a value at which the reset circuit itself can operate in a defined manner. However, owing to its slower rise, the auxiliary signal still remains below the supply voltage. The reset circuit compares the level of the auxiliary signal with a defined voltage threshold and outputs a reset signal until the voltage threshold is reached. In the event of the threshold being exceeded, the reset circuit withdraws the reset signal. In practical cases of this solution, the reset signal usually follows the rising supply voltage until it is cleared by the reset circuit.

A fundamental problem arises if the supply voltage rises very slowly. As a result, the low-pass filter loses its effect and the auxiliary signal and the supply voltage have a similar rate of rise and an instance of the threshold voltage being exceeded can be detected only with difficulty. In such a case, the reset circuit-would turn off the reset signal if the supply voltage is high enough in order that the reset circuit itself can operate in a defined manner. However, the supply voltage may still be too low for other circuits, so that they cannot correctly evaluate the reset signal and consequently attain an undefined state. Moreover, it can happen that the reset circuit generates no reset signal whatsoever in the event of an excessively slow rise. In order to ensure that the auxiliary signal rises significantly more slowly than the supply voltage itself even in the event of a slow rise in the supply voltage, it is necessary to dimension the low-pass filter with a very large time constant. However, such low-pass filters can be realized only in complex fashion and with difficulty in integrated circuits and lead to high costs.

A further problem arises in an integrated circuit that has a plurality of supply voltage domains and is supplied by external circuitry from a plurality of different supply voltage sources. Although it can be ensured that the different sources are turned on virtually simultaneously, the rise in the supply voltages may proceed at different rates on account of different connected load impedances. Therefore, at each supply voltage domain, a dedicated reset circuit should be provided which detects the voltage rise and correspondingly outputs a reset pulse to the connected subcircuit. However, the space taken up for such a solution is disproportionately high and it has been proposed to provide only one reset circuit, which emits a reset pulse until it is ensured that all the supply voltage domains are supplied with the voltage required for operation. However, since many circuits have a high shunt current when a reset signal is present, such a solution with a reset signal that is present continuously and for a long time leads, during this time duration, to a high power consumption and a high continuous current which, under certain circumstances, cannot be provided by the supply source for this time.

Document DE 19534785 C1 shows a circuit for generating an enable signal. In this case, a delay device is provided, which temporally delays the reset signal until connected elements have reached a stable state.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

The invention is directed to a circuit arrangement for generating a reset signal which operates reliably and in which the current consumption is reduced.

A reset generator circuit is provided, which has an oscillator circuit having a control input and an output, the oscillator circuit being designed for outputting a clock signal. The reset generator circuit comprises a delay circuit having a clock signal input, which is connected to the output of the oscillator circuit, and furthermore has a signal output and a control input. The delay circuit can be activated by a control signal at the control input. The delay circuit is designed for outputting a first signal after a first predetermined time period and then for outputting a second signal after a second predetermined time period after the outputting of the first signal. Furthermore, the reset generator circuit comprises a generator circuit having a signal input and a reset signal output. The generator circuit can also be activated by a control signal at a control input. The generator circuit, the signal input of which is connected to the signal output of the delay circuit, is designed for outputting a reset signal in the event of a detection of the first signal at the signal input up to the detection of the second signal at the signal input. Finally, the reset generator circuit contains a comparison device designed for a comparison of a supply potential with a potential threshold value and for outputting the control signal to a signal output in the event the potential threshold value is exceeded. The signal output of the comparison device is connected to the control input of the delay circuit and to the control input of the generator circuit.

The output of a control signal after a potential threshold value has been exceeded by the comparison device ensures an error-free operation of the reset generator circuit according to the invention. In this case, the generator circuit generates the reset signal for further digital subcircuits. By means of the delay circuit of the reset generator circuit according to the invention, the transmission of a reset signal by the generator circuit is delayed until it is ensured that the supply voltages of all the subcircuits connected to the generator circuit are sufficient. When the reset signal is transmitted, the connected subcircuits evaluate it correctly and attain a defined initial state.

It is important that all the specified units are connected to the same supply voltage line and the same ground or reference potential line. The reset generator circuit according to the invention has the advantage that connected circuits are set into the defined initial state at a sufficient temporal distance from the rise in the supply voltage.

Thus, it is advantageous if the generator circuit and the delay circuit have a defined initial state for an operation, into which they are set by a signal at the control input. Consequently, if an error occurs during the operation of the reset generator circuit according to the invention, e.g. due to a dip in the supply voltage, then the generator circuit and the delay circuit can be reset into the initial state by the control signal and an erroneous operation of the reset generator circuit is prevented.

One refinement of the invention is the design of the generator circuit for outputting a turn-off signal to a second output after a detection of the second signal at the signal input. The second output of the generator circuit is connected to the control input of the oscillator circuit. The oscillator circuit is designed such that it can be turned off by a signal at the control input. As a result, the generator circuit transmits not only a reset signal but also a turn-off signal to the oscillator circuit if the latter is no longer required. As a result, the current consumption of the entire reset generator is significantly lower.

In another refinement, the generator circuit is designed for outputting the reset signal after a detection of a first rising edge of a signal at the signal input up to a detection of a second rising edge of the signal. The reset signal is therefore transmitted until a second rising edge has been detected. This is expedient in particular when the delay circuit is designed as a frequency divider circuit. As a result, the reset signal of the reset generator circuit is formed for a clock period of the frequency divider output.

In yet another refinement of the circuit arrangement, the oscillator circuit comprises a ring oscillator.

In an advantageous development of the invention, the comparison device comprises a first and a second detection circuit. The first detection circuit is designed for outputting a switching signal to the second detection circuit as soon as the supply potential exceeds a threshold value. The second detection circuit can be activated by the switching signal of the first detection circuit and is designed for outputting the control signal as soon as the supply potential exceeds the potential threshold value. As a result, the first detection device activates the second detection circuit when the supply potential is sufficient for an error-free operation of the second detection circuit.

In an expedient development, the first detection device of the comparison device has a first controllable path, the first terminal of which is connected to a reference potential terminal and the control terminal of which is connected to a second terminal and a first terminal of a second controllable path. A second terminal of the second controllable path is connected via a charge store to a supply potential terminal. A control terminal of the second controllable path is designed for feeding the supply potential. Furthermore, a node is provided between the charge store and second terminal of the second controllable path, at which it is possible to tap off the switching signal for activation of the second detection circuit. It is expedient in this context if the first and second controllable paths are in each case formed by a field-effect transistor of a first conduction type.

In another development of the invention, the second detection circuit of the comparison device comprises an inverter, the ratio of which between its changeover point and the difference between supply potential and the reference potential is very low. The inverter thus has a high asymmetry which, moreover, represents the potential threshold which, when exceeded, results in the control signal being output by the comparison device.

In another refinement of the invention, the comparison device is designed for outputting a differential signal. In this case, the differential signal is defined by a first and a second logic level. This is particularly advantageous since external interference influences on the reset signal are significantly reduced.

In another development of the circuit arrangement according to the invention, the delay circuit comprises a counting device. The latter is designed for outputting a first signal after a first number of clock periods of a clock signal and for outputting a second signal after a second number of clock periods of the clock signal. It is thus advantageously possible to establish a delay up to the transmission of the reset signal by the generator circuit and also the duration of the transmission of the reset signal by the generator circuit. Furthermore, the delay and also the duration are only dependent on the oscillator frequency. It is particularly simple in terms of circuitry for the first number of clock periods and the second number of clock periods, that is to say the delay and also the duration, to be chosen with equal magnitude. As an alternative, the first number of clock periods and the second number of clock periods differ in magnitude.

In a further expedient refinement of the invention, at least two series-connected bistable multivibrators that form an asynchronous binary counter are provided in the counting device of the delay circuit. In another development, the delay circuit is designed as an input pulse counter with two alternate counting thresholds.

BRIEF DESCRIPTION OF THE DRAWINGS

The invention is explained in detail below on the basis of an exemplary embodiment taking account of the drawings, in which.

DETAILED DESCRIPTION OF THE INVENTION

Figure 1:
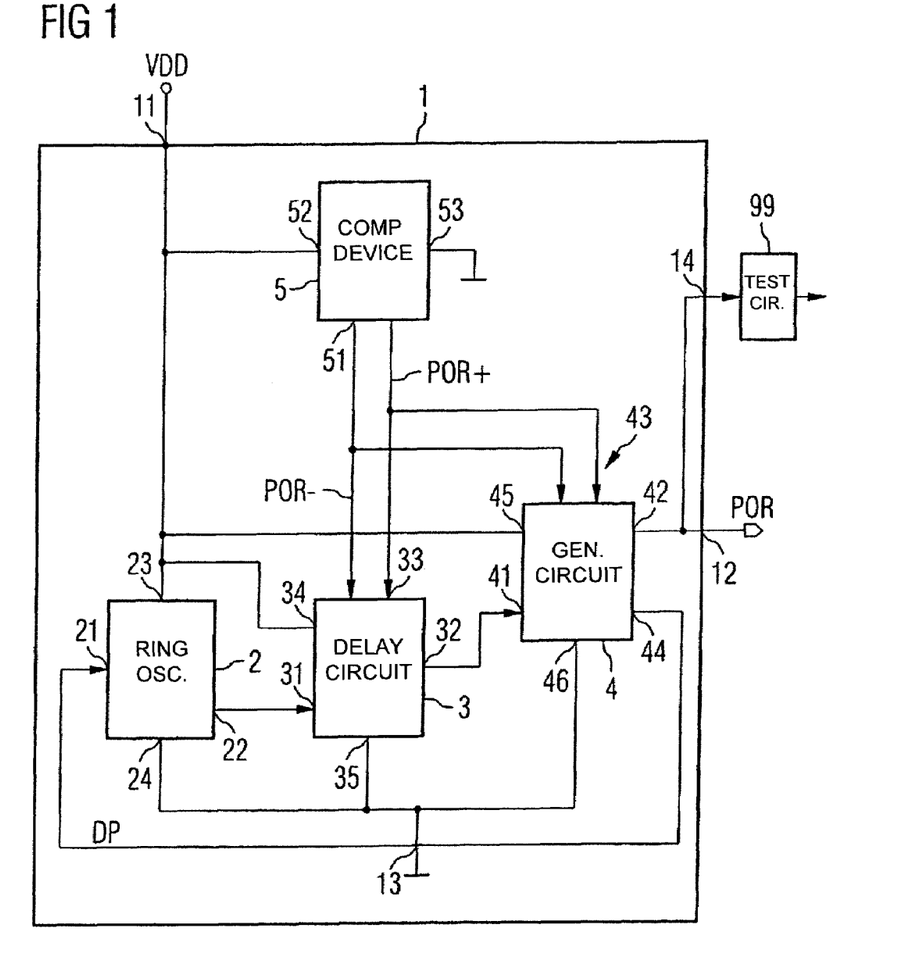
FIG. 1 shows a block diagram of the reset generator circuit.

FIG. 1 shows a reset generator circuit for generating a reset signal. It is called reset generator hereinafter. The reset generator has an input 11 for feeding a supply potential VDD and an output 13 for the ground potential. Furthermore, it contains a signal output 12, at which the reset signal of the reset generator 1 can be tapped off.

The reset generator 1 comprises a ring oscillator 2 having a supply terminal 23 for the supply potential VDD and a ground terminal 24 for the ground potential, and also a switching input 21 and a clock signal output 22. The ring oscillator 2 generates a clock signal and outputs the latter at the output 22. It can be turned off by a control signal at the switching input 21. The output 22 of the ring oscillator 2 is connected to a clock signal input 31 of a delay circuit 3.

The delay circuit 3 is also connected to the supply potential VDD via its supply input 34 and to the ground potential via its ground terminal 35. It furthermore has a control input 33 having two terminals and a signal output 32. The delay circuit is designed such that it delays a clock signal at the input 31 and outputs it only after a specific first time period at the output 32. A second signal at the signal output 32 is in turn output only after a second time period. Consequently, in a simple embodiment, the delay circuit 3 operates as a frequency divider that divides the period of the clock signal of the ring oscillator 2 at its input 31 in a specific ratio and outputs a clock signal with a larger period. The circuit can be set into a defined initial state by a control signal at the two terminals of the control input 33.

The reset generator 1 furthermore contains a generator circuit 4, the signal input 41 of which is connected to the signal output 32 of the delay circuit 3. The generator circuit is connected to the supply potential VDD and the ground potential via the terminals 45 and 46 and furthermore contains a control input 43 likewise having two terminals. The reset signal can be tapped off at the first output 42 of the generator circuit. A second output 44 is connected to the switching input 21 of the ring oscillator. When a first signal is present at the signal input 41, the generator circuit generates the reset signal at the output 42 and turns this off when a second signal is present at the input 41. For this purpose, it in each case determines the rising edges of the output signals of the delay circuit 3 at the terminal 32.

Finally, the reset generator 1 has a comparison device 5, which ensures an error-free operation of the delay circuit 3 and of the generator circuit 4. For this purpose, it is likewise connected to the supply potential input 11 by its supply input 52. The terminal 53 of the comparison device 5 carries the ground potential. The sensor circuit 5 has a control output 51 having two taps for a differential control signal and is connected by its signal output 51 to the respective control input of the generator circuit 4 and of the delay circuit 3.

A supply potential VDD present at the input of the reset generator 1 is detected by the comparison device 5 via its input 52. The comparison device generates a differential control signal POR+ and POR−, the signal POR+ being a control signal with positive logic and the signal POR− being a signal with negative logic. Upon activation, these signals hold the delay circuit 3 and also the generator circuit 4 in a reset state and represent internal reset signals for the reset generator 1. While the supply potential VDD rises further, the ring oscillator 2 starts to operate and generates a clock signal at its clock output. In the event of a further rise in the supply potential VDD, at some time the delay circuit 3 and also the generator circuit 4 obtain a sufficient supply voltage and could operate. However, by virtue of the applied control signal at the inputs 33 and 43, both circuits remain in a defined output state, and a reset signal is not yet emitted at the reset output 12 of the reset generator 1.

In the event of a further rise in the supply potential, the latter exceeds a supply potential threshold in the comparison device 5. Said potential threshold is set with a magnitude such that when it is exceeded, the supply potential is sufficient for the error-free operation of the generator circuit 4 and of the delay circuit 3. The comparison device 5 thereupon switches the internal reset or control signals POR− and POR+ to the respective other logic level and the generator circuit 4 and also the delay circuit 3 start to operate.

After a specific time after the changeover of the reset signals POR+ and POR−, the delay circuit 3 outputs a first clock signal at its output 32, and the generator circuit 4 thereupon generates the reset signal POR at its output. The reset signal is maintained until the generator circuit again detects a further clock signal at its input 41.

The signal delay after turning off the internal reset signals POR+ and POR− in the delay circuit 3 ensures that even supply potentials of other supply potential domains have enough time to rise, so that when the reset signal is emitted, all the circuits can correctly evaluate it. At the same time, the long emission duration of the reset signal prevents an erroneous detection on account of attenuations of the reset signal.

For the purpose of testing during the production process, the reset generator 1 furthermore has a test input 14 connected to a test circuit 99. The reset signal POR can thereby be tested in respect of its validity.

Figure 2:
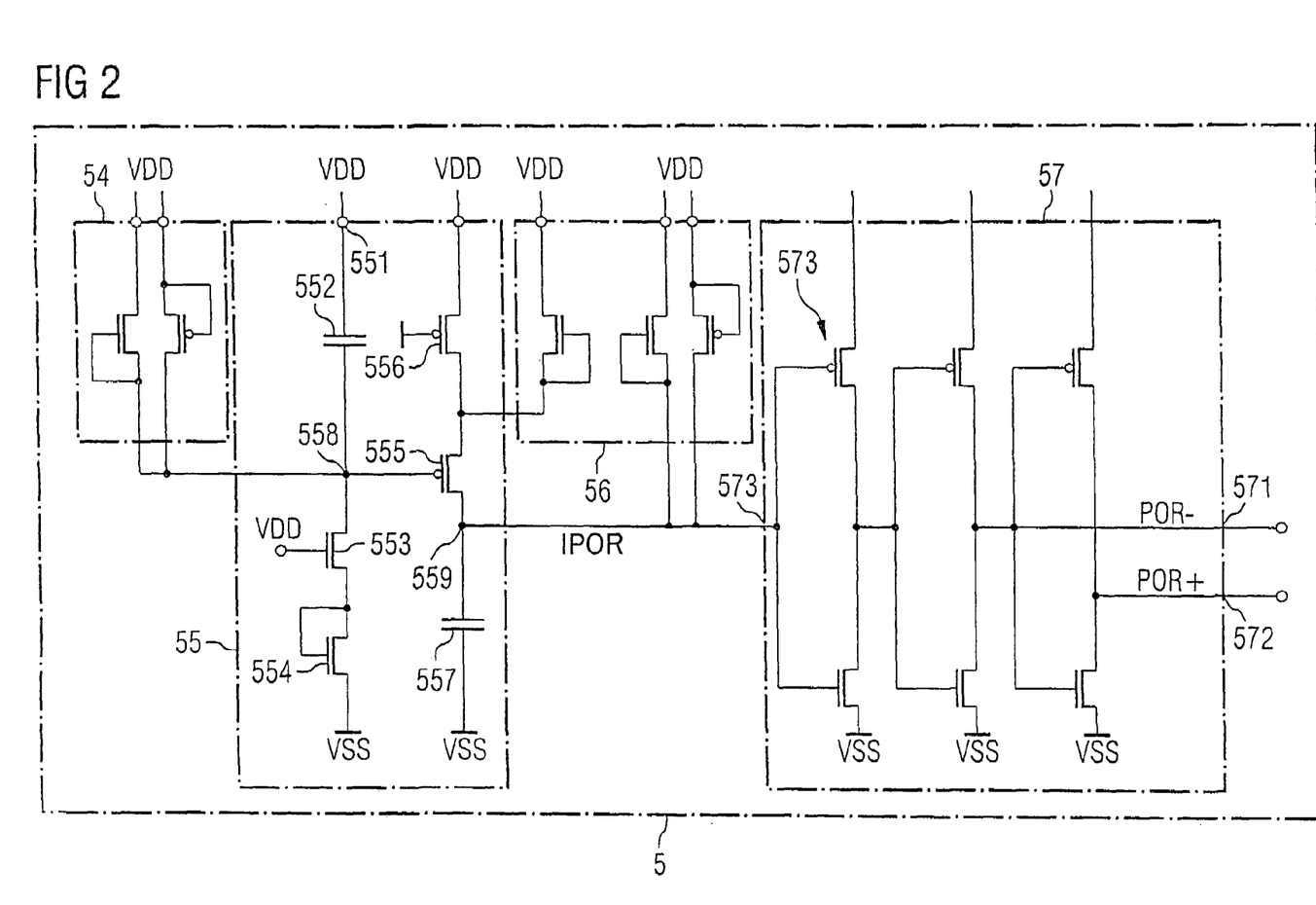
FIG. 2 shows an exemplary embodiment of the comparison device.

FIG. 2 shows one embodiment of the comparison device 5. The latter contains four subcircuit blocks 54, 55, 56 and 57. In this case, the circuit 55 forms a detection and switching device for the inverter chain 57, the outputs 571 and 572 of which form the taps of the output 51 of the comparison device 5 and carry the internal control signals POR− and POR+.

The detection arrangement 55 has a capacitor 552, one terminal of which is connected to an input 551 of the detection arrangement 55 that carries the potential VDD. A second terminal of the capacitor 552 leads to a node 558 and furthermore to a drain terminal of an nMOS transistor 553, the control terminal of which is likewise connected to the supply potential VDD. The source terminal of the nMOS transistor 553 is connected to a drain terminal of a second nMOS transistor 554 and also to the control terminal of the nMOS transistor 554. The source terminal of the second nMOS transistor 554 leads to a ground terminal.

Furthermore, the detection device 55 contains a first and a second pMOS transistor 555 and 556 that are connected in series, the source terminal of the pMOS transistor 556 carrying the supply potential VDD. The drain terminal of the pMOS transistor 555 is connected to one terminal of a capacitor 557, the other terminal of which is connected to the ground potential VSS. The control terminal of the pMOS transistor 556 is likewise connected to the ground potential; the control terminal of the pMOS transistor 555 leads to the node 558.

The node 558 furthermore has a connection to a circuit block 54 formed from two MOS transistors of opposite charge types. The respective other terminals lead to the supply potential VDD. The control terminal of the nMOS transistor of the circuit block 54 is connected to the node 558. The control terminal of the pMOS transistor is connected to the supply potential. A tap is provided at node 559 between the drain terminal of the pMOS transistor 555 and the terminal of the capacitor 557, said tap being connected to a circuit block 56. The latter is constructed in a manner similar to the circuit block 54. In this case, the node 559 is connected in the same way to two transistors of opposite charge types. In addition, the circuit block contains a further nMOS transistor, one terminal of which is coupled to the supply potential VDD. The other terminal is connected together with its control terminal between the pMOS transistors 556 and 555.

Furthermore, the node 559 leads to the input 573 of the inverter chain 57. The inverter chain 57 comprises three inverters which are in each case a pMOS and nMOS transistor connected between supply potential VDD and ground potential VSS. One terminal of a pMOS transistor is in each case connected to the supply potential VDD and it is connected by its respective second terminal to an nMOS transistor. The other terminal of the respective nMOS transistor leads to the ground potential VSS. In this case, the terminal 573 of the inverter chain 57 is connected to the control terminal of the first pMOS transistor and of the first nMOS transistor, which form the first inverter 573.

The control terminals of the MOS transistors of the second inverter are connected between the connection of the pMOS and nMOS transistors of the first transistor pair. The control terminals of the third transistor pair are connected between the transistors of the second inverter and are simultaneously connected to the output 571 of the inverter chain. A tap between the two transistors of the third inverter forms the output 572 of the inverter chain. The two transistors of the first inverter are dimensioned such that the changeover point of the first inverter takes place only in the event of a very high supply potential VDD. The two subsequent inverters serve for again changing over the polarity of the signal, for improving the signal quality and for providing a signal with opposite polarity.

The sensor circuit or comparison device 5 functions as follows. In the event of a rise in the supply potential VDD and thus in the supply voltage, the node 558 is capacitively concomitantly pulled up. At the same time, the potential rises at the control terminal of the nMOS transistor 553. If the node 558 reaches a value of the threshold voltage VthNMOS, the transistor 553 becomes conductive, and so does the nMOS transistor 554 at twice the threshold voltage VthNMOS. The transistor 554 operates like a diode. As a result, the capacitor 552 starts to be discharged via the discharge path formed by the transistors 553 and 554. The node 558 and thus the capacitor 552 is discharged until the voltage across the transistor 554 is clamped at the threshold voltage.

At the same time as this, the supply voltage likewise rises at the source terminal of the transistor 555 as soon as the voltage between VDD and ground has exceeded the threshold voltage VthPMOS of a pMOS transistor and the transistor 556 turns on as a result. The transistor 556 acts only as a resistor that keeps the charging current in the capacitor low. Therefore, the transistor 555 starts to conduct at the earliest when the node 558 has reached a potential corresponding to the value of twice the threshold voltage VthNMOS of the transistors 553 and 554. When the conductivity of the transistor 555 commences, a charging current flows onto the capacitor 557. The potential at the node 559, which was equal to the ground potential before the conductivity commenced, now rises slowly.

Therefore, the two transistors 553 and 554 and also the capacitor 552 realize a detection device that switches the transistor 555 into a conductive state when a first threshold value—twice the threshold voltage—is exceeded. Said transistor, together with the capacitor 557 and the transistor 556, forms an RC element, and directly prescribes the time constant of the charging process of the capacitor 557. This circuit ensures that the transistor 555 switches into a conductive state only starting from a certain supply potential and, moreover, the resultant rise in the internal signal IPOR is always smaller than the rise in the supply potential VDD. It is advantageous that the circuit does not have a resistive current path between the supply voltage VDD and ground, so that no static quiescent current is consumed.

The signal IPOR rises at the control inputs of the first inverter 573 of the inverter chain 57. Since the inverter chain 57 and in particular the first inverter 573 are constructed particularly asymmetrically, the signal POR− at the output 571 is for a long time the ground potential. The signal POR+ at the output 572 follows the supply potential VDD. Such a signal profile corresponds to an internal reset signal of the reset generator 1. Only if the internal signal IPOR has exceeded the changeover point of the first inverter pair do the levels of the two output signals POR− and POR+ change. The signal POR− at the output 571 now has the supply potential VDD, and the signal POR+ has the ground potential. The internal reset signal is turned off as a result of the interchanging of the polarity.

The circuit blocks 54 and 56 represent, in principle, diodes that are connected in the reverse direction and remain in a blocking state during a normal rise in the supply potential. They are used to detect rapid dips in the supply potential VDD which are not identified by the circuit 55. In the event of a dip in the supply potential VDD, the pMOS and nMOS transistors of the circuit blocks 54 and 56 switch into a conducting state and discharge the node 558 and 559. As a result, the internal signal IPOR falls to a low level, which leads to a changeover of the levels at the signal outputs 571 and 572. The POR− signal again has a low level, and the POR+ signal has a high level. A reset signal is again transmitted to the generator circuit 4 and the delay circuit 3.

Figure 3:
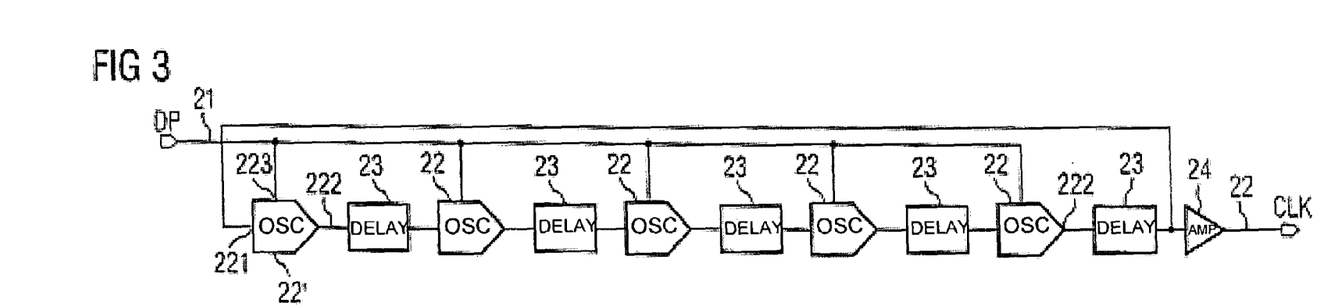
FIG. 3 shows a block diagram of a ring oscillator.

FIG. 3 shows an exemplary embodiment of a ring oscillator 2 of the reset generator 1. The latter is constructed from five series-connected inverting oscillator elements 22 interconnected by additional, noninverting passive delay elements 23. A further delay element 23 and an amplifier 24 are connected to the output 222 of the last oscillator element 22. The clock signal CLK of the ring oscillator 2 can be tapped off at the output of the amplifier 24. A tap is provided between the output of the last delay element 23 and the input of the amplifier 24, said tap feeding the clock signal CLK back to the input 221 of the first oscillator element 22'.

Furthermore, each oscillator element 22 has a control input 223 by means of which the element is turned off in the event of detection of a turn-off signal DP. The individual oscillator elements 22 have an inverting function and are dimensioned such that they can operate even at low supply voltages. What is thus achieved, together with the delay elements 23, is that the ring oscillator generates rectangular pulses with a relatively low frequency.

Figure 4:
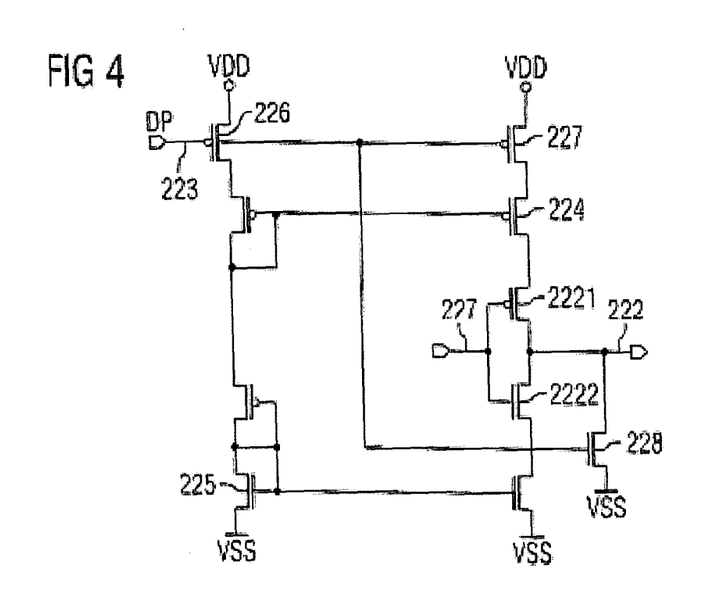
FIG. 4 shows a detail from the ring oscillator.

The configuration of such an oscillator element 22 can be seen in FIG. 4. The oscillator element 22 contains a first pMOS current mirror 224, and an nMOS current mirror 225 connected in series therewith. Furthermore, the element has an inverter connected into a signal path between the two current mirrors. The two current mirrors 224 and 225 serve for limiting the switching current of the inverter. The inverter comprises a pMOS transistor 2221 and an nMOS transistor 2222 connected in series therewith, the control terminals of which are connected to the input 221 of the oscillator element 22. One of the two transistors is in the off state depending on the level at the input of the inverter. As a result, the inverted level with respect to the level of the input signal is present at the output 222.

In addition, the terminals of the pMOS transistors of the current mirror 224 are connected to the supply potential VDD via two further pMOS transistors 226 and 227. The control terminals of the transistors 226 and 227 are connected to the control input. Both current mirrors 224 and 225 and thus also the inverter can be completely turned off by means of the turn-off signal DP at a logic high level. At the same time, the output of the oscillator element 22 is pulled to the ground potential VSS by an nMOS transistor 228 connected to the output 222.

Figure 5:
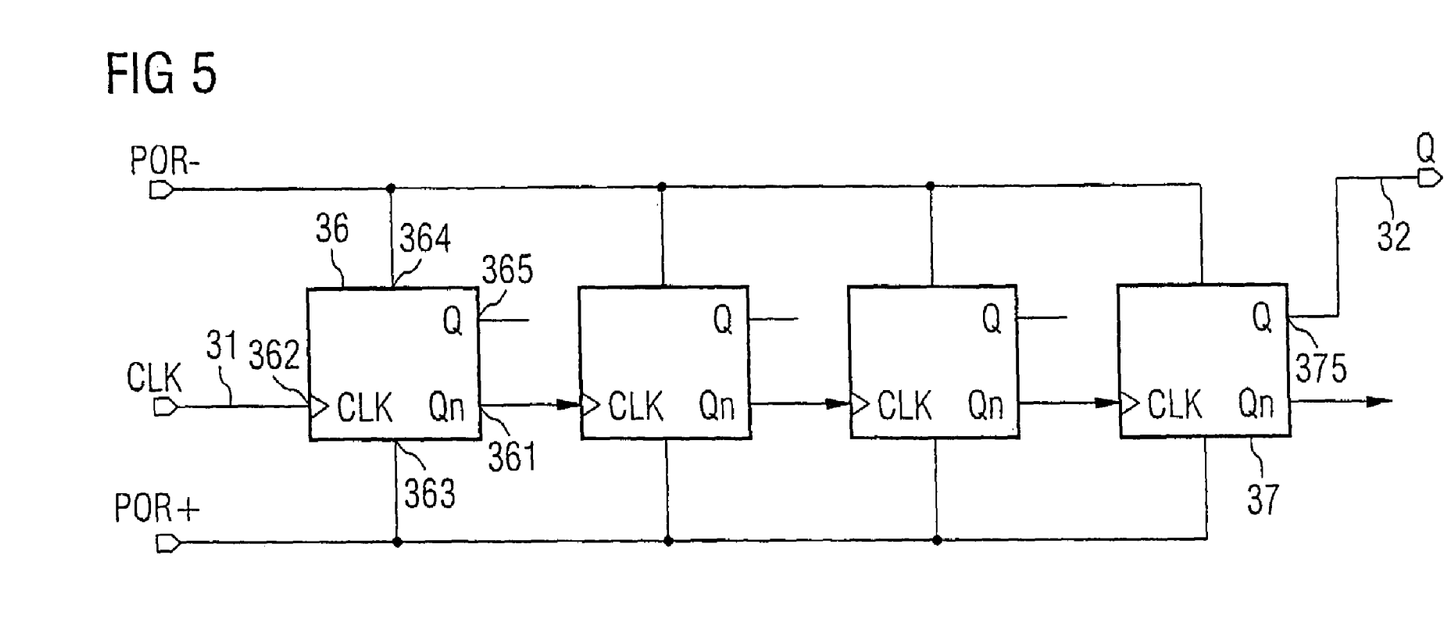
FIG. 5 shows a block diagram of the delay circuit.

The clock signal CLK, which is generated by the ring oscillator 2 and is output at its output 22, is fed to the delay circuit 3, the exemplary embodiment of which is shown in FIG. 5. The delay circuit 3 is constructed as an asynchronous counter circuit comprising a total of four special toggle flip-flops. The asynchronous counter is connected up with its toggle flip-flops such that, after 16 clock periods of the clock signal CLK at the input 31, an edge change of the output signal is generated at the output 32. Consequently, the asynchronous counter operates as a frequency divider that divides the frequency of the clock signal CLK by the factor 16 and generates a new clock signal therefrom.

The four toggle flip-flops of the delay circuit 3 are cascaded in series, so that their respective output 361 that carries the inverted data signal Qn is connected to the input 362 of the subsequent toggle flip-flop. The inverted data signal Qn of one flip-flop therefore forms the clock signal CLK for the subsequent toggle flip-flop. The input 362 of the first flip-flop 36 is connected to the clock signal input 31 of the delay circuit 3. The data output 375 of the last toggle flip-flop 37 simultaneously forms the signal output 32 and carries the control signal Q. Furthermore, each toggle flip-flop contains two reset inputs 363 and 364 for the internal reset signals POR+ and POR−, respectively. The reset signals switch each toggle flip-flop into an inactive state.

If the POR− signal has a low level and the POR+ signal has a high level, then the toggle flip-flops are held in a reset state. No signal Q is output at the output 32. If the supply voltage suffices, the sensor circuit 5 inverts the levels of the two signals POR+ and POR− and the toggle flip-flops of the asynchronous counter start to operate. With each rising edge of a clock signal CLK, the signal level at the output 361 of each toggle flip-flop is inverted until an overflow at the last toggle flip-flop 37 generates at the output 375 thereof a signal with a high level. This is done for the first time after a specific number of clock periods of the clock input signal CLK. For the same number of further clock periods, the signal Q at the output 32 remains at a logic high level and is not reset until after a renewed overflow.

Figure 6:
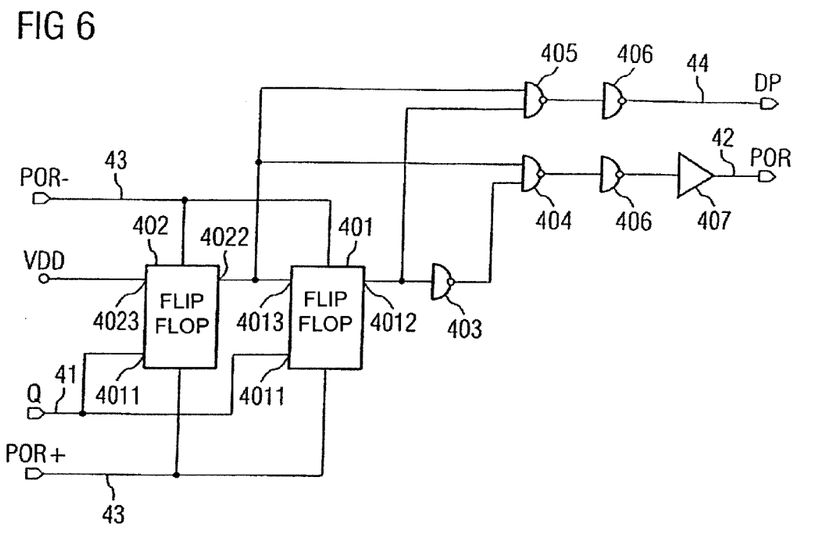
FIG. 6 shows an exemplary embodiment of the generator circuit.

The output signal Q is fed to the generator circuit 4. FIG. 6 shows an exemplary embodiment of such a generator circuit.

The generator circuit 4 contains two D-type flip-flop circuits 401 and 402, each having two reset inputs for the internal control signals POR+ and POR−. The clock signal inputs 4011 of the two D-type flip-flops 401 and 402 are connected to the input 41 of the generator circuit 4. The data input 4013 of the D-type flip-flop 402 is connected to a supply potential terminal for the supply potential VDD, and the data output 4022 of the D-type flip-flop 402 is connected to the data input 4013 of the flip-flop 401. Furthermore, it leads to a first input of a logic NAND gate 405. The data output 4012 of the D-type flip-flop 401 is connected to the other input of the NAND gate 405. The latter is connected via an inverter 406 to the output 44 for the turn-off signal DP.

Moreover, the output 4022 of the D-type flip-flop 402 is connected to a first input of a second NAND gate 404. The output 4021 of the D-type flip-flop 401 is also connected via an inverter 403 to the second input of the NAND gate 404. The output of this gate is connected to the output 42 of the generator circuit 4 via a second inverter 406 and an amplifier 407. At said output 42, it is possible to tap off the reset signal POR for all the digital subcircuits.

If the internal reset signal is present at the reset inputs of the flip-flops 401 and 402, then the D-type flip-flops 401 and 402 remain in an inactive state. A signal with a logic low level can be tapped off at their respective outputs, as a result of which the output signals POR and DP likewise have a logic low level.

The D-type flip-flops operate as soon as the reset signal by inverting the levels of the signals POR− and POR+. At this point in time, the supply potential VDD at the data input 4023 of the first D-type flip-flop is already at a high level. In the event of the detection of a rising edge of the signal Q, the D-type flip-flop 402 generates at its output 4022 a signal with a logic high level in accordance with the level of the supply potential VDD at its data input 4023.

At the same time, the D-type flip-flop 401 generates at its data output 4012 a signal with a logic low level. By virtue of the logic gate 405 and the inverter 406, a logic low level results for the turn-off signal DP at the output 44, and a logic high level results for the reset signal POR at the reset output 42.

During the subsequent rising edge of the clock signal Q, the level of the signal at the output 4022 of the first D-type flip-flop 402 remains at a logic high level. At the same time, the D-type flip-flop 401 switches the signal at its output 4012 likewise to a logic high level. The output of the NAND gate 405 thereby becomes low, and the turn-off signal DP for the ring oscillator with a logic high level is output at the turn-off output 44.

The signal at the output 4012 is inverted by the inverter 403 and fed to the second input of the NAND gate 404. The reset signal POR at the output 402 falls back to a logic low level and is thus turned off.

The generator circuit therefore generates a reset signal POR at its output 42 in a manner dependent on a detection of rising edges on a clock signal Q. In this case, the length of said reset signal is dependent on the duration between two rising edges occurring in the input signal Q. If, after the occurrence of a first rising edge at the clock signal Q, an internal reset signal POR+ and POR− is registered at the reset inputs of the D-type flip-flops 401 and 402, the D-type flip-flops 401 and 402 are reset and the reset signals DP and POR of the generator circuit are turned off. As a result, a reset process of the reset generator starts from the beginning. The two D-type flip-flops 401 and 402 are constructed such that they can operate correctly even at very low supply voltages and thus correctly evaluate the internal reset signals of the comparison device 5 that are present.

Figure 7:
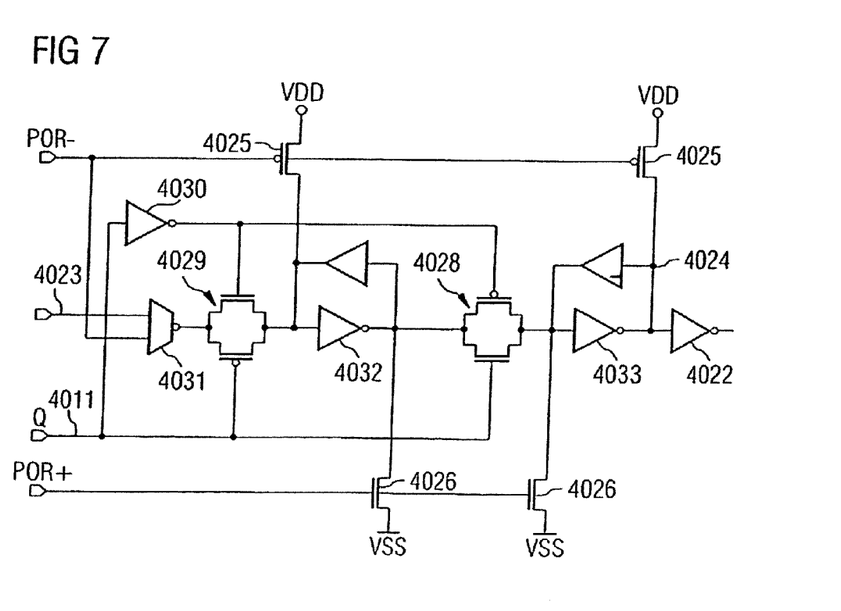
FIG. 7 shows a circuit diagram of a flip-flop circuit in the generator circuit in accordance with FIG. 6 and the delay circuit in accordance with FIG. 5.

FIG. 7 shows a configuration of the two D-type flip-flops 401 and 402.

The line that in this case carries the internal reset signal POR− is connected to the control terminal of two pMOS transistors 4025. The internal reset signal POR+ is passed to the control terminal of two nMOS transistors 4026. Through the transistors 4026, the ground potential VSS is fed to an input of a first inverter 4033, the output of which is connected to a node 4024 and an input of an output inverter 4022. The supply potential VDD is switched to the input of the output inverter 4022 through one of the transistors 4025. The respective second transistors switch the supply potential and ground potential into the data path of the flip-flop. Therefore, if a reset signal POR+ and POR− is applied to the reset signal inputs, then the D-type flip-flop, independently of a clock signal or a signal at the data input 4023, always generates a signal at the output of the inverter 4022 with a logic low level.

The flip-flop circuit itself contains two series-connected MOS transistor pairs 4028 and 4029 connected to one another via an inverter 4032. Each MOS transistor pair comprises a pMOS transistor and an nMOS transistor connected in parallel with one another. The nMOS transistor of the first pair 4028 and the pMOS transistor of the second pair 4029 are connected by their control terminals, via an inverter 4030, to the clock signal input 4011 for the clock signal Q. The control terminals of the respective other MOS transistors are directly connected to the input 4011.

A pair of terminals of the first MOS transistor pair 4029 are respectively connected to the output of a NAND gate 4031, the first input of which forms the input 4023 for the data signal, and the other input of which is connected to the line for the reset signal POR−. The other two terminals of the first transistor pair 4029 are connected via an inverter 4032 to two terminals of the second pair 4028. The other two terminals of the second MOS transistor pair 4028 lead to the output of the D-type flip-flop via the first and second inverters 4033 and 4022.

During operation, in the event of a rising edge of the clock signal, the D-type flip-flop outputs the level at the input 4023 at the output 4034 again. The D-type flip-flop illustrated in FIG. 7 can be formed in a simple manner into the toggle flip-flops required for the delay circuit 3 of FIG. 5, by the node 4024 being fed back to the input 4023. In both cases, it is ensured that the flip-flops are reliably halted by a reset signal at the POR+ and POR− signals and, at the same time, operate without any errors even at low supply voltages.

The reset generator according to the invention therefore generates a reset signal by means of the delay device and the generator circuit, it being possible to set the start of the reset signal and also the duration by means of the delay device. As a result, subcircuits belonging to other supply voltage domains can also be reset without any errors by means of the reset generator. The comparison device of the reset generator ensures that the reset generator itself likewise operates without errors. The first detection circuit in the comparison device ensures that the instance of the potential threshold being exceeded is unambiguously registered. How the voltage rise has proceeded until then is unimportant in this case.

Although the invention has been shown and described with respect to a certain aspect or various aspects, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several aspects of the invention, such feature may be combined with one or more other features of the other aspects as may be desired and advantageous for any given or particular application. Furthermore, to the extent that the term "includes" is used in either the detailed description or the claims, such term is intended to be inclusive in a manner similar to the term "comprising."

LIST OF REFERENCE SYMBOLS

1 Reset generator
2 Ring oscillator
3 Delay circuit
4 Generator circuit
5 Comparison device
11 Supply potential terminal
12 Reset signal output
13 Ground potential terminal
14 Test signal input
21 Switching input
33, 43 Control input
22 Clock signal output
23,34,45 Supply potential input
24,35,46 Ground potential input
31 Clock signal input
32 Signal output
41 Signal input
42 Reset signal output
44 Control signal output
POR Reset signal
POR+, POR− Internal reset signals
54,56 Circuit blocks
55 Detection circuit
57 Inverter chain
552,557 Capacitors
553,554 MOS transistors of the nMOS type
556,555 MOS transistors of the pMOS type
558,559 Nodes
573 Input
571, 572 Reset signal outputs
IPOR Internal reset signal
DP Turn-off signal
CLK Clock signal
23 Delay element
22 Oscillator element
221 Oscillator input
222 Oscillator output
223 Oscillator element control input
224, 225 Current mirrors
226, 227 Turn-off transistors
2221,222 Inverter elements
36, 37 Toggle flip-flops
Q, Qn Data signals
362 Signal input
363, 364 Reset input
365, 375 Data output
401, 402 D-type flip-flops
4013,4023 Data signal inputs
4011 Clock signal inputs
4022,4012 Data outputs
403, 406 Inverters 404, 405 NAND gates
407 Amplifier
4024 Node
4025, 4026 Turn-off transistors
4028, 4029 Transistor pairs

The invention claimed is:

1. A reset generator circuit for generating a reset signal, comprising:
   an oscillator circuit configured to output a clock signal to an output thereof;
   a delay circuit comprising a clock signal input connected to the output of the oscillator circuit, the delay circuit further comprising a signal output and a control input, and configured to be activated by a control signal at the control input, and output a first signal state after a first predetermined time period, and output a second signal state after a second predetermined time period after outputting the first signal state;
   a generator circuit comprising a signal input coupled to the signal output of the delay circuit, and a reset signal output, and configured to be activated by the control signal at a control input thereof, and further configured to output a reset signal in the event of a detection of the first signal state at the signal input thereof until a detection of the second signal state at the signal input of the generator circuit; and
   a comparison device configured to compare a supply potential with a potential threshold value and output the control signal to a signal output thereof when the supply potential exceeds the potential threshold value, wherein the signal output thereof is connected to the control input of the delay circuit and the control input of the generator circuit,
   wherein the generator circuit is further configured to output a turn-off signal to a second output thereof after the detection of the second signal state at the signal input, and the second output is coupled to a control input of the oscillator circuit, wherein the oscillator circuit is turned off in response to the turn-off signal at the control input.

2. The reset generator circuit as claimed in claim 1, wherein the generator circuit or the delay circuit comprise a specific initial operating state and are switched into the initial state by the control signal at the control input.

3. The reset generator circuit as claimed in claim 1, wherein the generator circuit is configured to output the reset signal upon a detection of a first rising edge of a signal comprising the first signal state until a detection of a second rising edge of the signal comprising the second signal state.

4. The reset generator circuit as claimed in claim 1, wherein the comparison device comprises a first detection circuit configured to output a switching signal to a second detection circuit thereof, wherein the second detection circuit is activated by the switching signal, wherein the first detection circuit outputs the switching signal when the supply potential exceeds a first threshold value, and wherein the second detection device is configured to output the control signal.

5. The reset generator circuit as claimed in claim 4, wherein a tap for the switching signal is provided between the charge store and the second terminal of the second controllable path.

6. The reset generator circuit as claimed in claim 4, wherein the second detection circuit of the comparison device comprises an inverter circuit having at least one asymmetrical inverter associated therewith, a ratio of which between a changeover point of the asymmetrical inverter and a difference between the supply potential and the reference potential is low.

7. The reset generator circuit as claimed in claim 4, wherein the first and second detection circuits of the comparison device comprise field-effect or bipolar transistors.

8. The reset generator circuit as claimed in claim 1, wherein the comparison device is configured to output the control signal as a differential control signal, the differential control signal comprising a first and a second logic level.

9. The reset generator circuit as claimed in claim 1, wherein the delay circuit comprises a counting device configured to output the first signal state after a first number of clock periods of the clock signal and output the second signal state after a second number of clock periods of the clock signal.

10. The reset generator circuit as claimed in claim 1, wherein the delay circuit comprises at least two series-connected bistable multivibrators configured to form an asynchronous binary counter.

11. The reset generator circuit as claimed in claim 1, wherein the delay circuit comprises a frequency divider.

12. The reset generator circuit as claimed in claim 1, wherein the oscillator circuit comprises a ring oscillator configured to output a rectangular-waveform clock signal.

13. The reset generator circuit as claimed in claim 1, wherein the comparison device comprises at least one third detection circuit configured to detect a supply potential fluctuation, wherein the comparison device is further configured to output the control signal after a detection of a supply potential fluctuation.

* * * * *